United States Patent
Nasu et al.

(10) Patent No.: US 9,673,769 B2
(45) Date of Patent: Jun. 6, 2017

(54) VARIABLE GAIN CIRCUIT AND TUNER SYSTEM PROVIDED WITH SAME

(71) Applicant: SOCIONEXT INC., Kanagawa (JP)

(72) Inventors: Takafumi Nasu, Osaka (JP); Shinichiro Uemura, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/014,621

(22) Filed: Feb. 3, 2016

(65) Prior Publication Data

US 2016/0156323 A1 Jun. 2, 2016

Related U.S. Application Data

(63) Continuation of application No. PCT/JP2014/002149, filed on Apr. 16, 2014.

(30) Foreign Application Priority Data

Aug. 7, 2013 (JP) .................. 2013-164186

(51) Int. Cl.
*H03F 3/193* (2006.01)
*H03G 3/30* (2006.01)
(Continued)

(52) U.S. Cl.
CPC ......... *H03G 3/3036* (2013.01); *H03F 1/0205* (2013.01); *H03F 1/0277* (2013.01);
(Continued)

(58) Field of Classification Search
USPC ...... 330/252–261, 310–311, 295, 124 R, 84, 330/286
See application file for complete search history.

(56) References Cited

U.S. PATENT DOCUMENTS 7,408,411 B2 * 8/2008 Kim .................... H03G 1/0088
330/124 R
8,018,285 B2 9/2011 Kim et al.
(Continued)

FOREIGN PATENT DOCUMENTS

JP 06-310961 A 11/1994
JP 2006-050074 A 2/2006
(Continued)

OTHER PUBLICATIONS

International Search Report dated Jul. 22, 2014, Issued in corresponding International Application No. PCT/JP2014/002149. (w/ partial English translation).
(Continued)

*Primary Examiner* — Hieu Nguyen
(74) *Attorney, Agent, or Firm* — McDermott Will & Emery LLP (57) ABSTRACT

A variable gain transconductance amplifier includes an amplifier transistor connected to an input node, a cascode transistor having a source connected to a drain of the amplifier transistor and having a drain connected to an output node, and a switching circuit connecting or disconnecting a node to which the amplifier transistor and the cascode transistor are connected to or from a fixed potential in a switchable manner. A variable gain circuit may include the variable gain transconductance amplifier.

21 Claims, 9 Drawing Sheets

(51) Int. Cl.
*H03F 1/02* (2006.01)
*H03G 1/00* (2006.01)
*H03F 1/22* (2006.01)
*H03F 3/45* (2006.01)
*H03F 1/32* (2006.01)

(52) U.S. Cl.
CPC ........... *H03F 1/223* (2013.01); *H03F 1/3205* (2013.01); *H03F 3/193* (2013.01); *H03F 3/45179* (2013.01); *H03G 1/0023* (2013.01); *H03G 1/0029* (2013.01); *H03G 1/0088* (2013.01); *H03G 3/3052* (2013.01); *H03G 3/3063* (2013.01); *H03F 2200/451* (2013.01); *H03F 2203/45306* (2013.01)

(56) References Cited

U.S. PATENT DOCUMENTS

| | | | | |
|---|---|---|---|---|
| 8,437,720 | B2* | 5/2013 | Burns | H03G 3/3036 330/254 |
| 2005/0242886 | A1 | 11/2005 | Johnson | |
| 2007/0296507 | A1 | 12/2007 | Hamaguchi | |
| 2009/0124227 | A1 | 5/2009 | Ishiguro | |
| 2009/0289711 | A1 | 11/2009 | Aiba | |
| 2011/0025421 | A1 | 2/2011 | Kim et al. | |
| 2011/0256857 | A1* | 10/2011 | Chen | H04B 1/525 455/422.1 |
| 2012/0139633 | A1 | 6/2012 | Nasu et al. | |

FOREIGN PATENT DOCUMENTS

| | | |
|---|---|---|
| JP | 2008-005160 A | 1/2008 |
| JP | 2009-124189 A | 6/2009 |
| JP | 2012-034191 A | 2/2012 |
| WO | 2008/023530 A1 | 2/2008 |
| WO | 2012/158429 A1 | 11/2012 |

OTHER PUBLICATIONS

Written Opinion of the International Searching Authority dated Jul. 22, 2014, issued in corresponding International Application No. PCT/JP2014/002149. (w/ partial English translation).

* cited by examiner

| MODE<br>GAIN | MAXIMUM<br>GAIN | | INTERMEDIATE<br>GAIN | | | MINIMUM<br>GAIN |
|---|---|---|---|---|---|---|
| ATT4[dB] | 0 | ↗ | -5 | -5 | -5 | -5 |
| Gm6[dB] | 15 | ↗ | 0 | OFF | OFF | OFF |
| ATT8[dB] | 0 | 0 | 0 | ↗ | -10 | -10 |
| Gm10[dB] | 4 | 4 | 4 | 4 | ↗ | -10 |

FIG. 14

VARIABLE GAIN CIRCUIT AND TUNER SYSTEM PROVIDED WITH SAME

CROSS-REFERENCE TO RELATED APPLICATION

This is a continuation of International Application No. PCT/JP2014/002149 filed on Apr. 16, 2014, which claims priority to Japanese Patent Application No. 2013-164186 filed on Aug. 7, 2013. The entire disclosures of these applications are incorporated by reference herein.

BACKGROUND

The present disclosure relates a cascode-type transconductance amplifier which is capable of reducing distortion and a variable gain circuit which is capable of reducing distortion and noise.

Tuner systems that receive transmitted signals each containing multiple channels and that select and demodulate a desired one of the multiple channels are required to have low-noise and low-distortion characteristics. For example, the Integrated Service Digital Broadcasting-Terrestrial (ISDB-T) in Japan has 40 channels, in total, from Channel 13 (473.143 MHz) to Channel 52 (707.143 MHz), where each channel has a signal band of 6 MHz. A tuner system is required to realize high sensitivity of −80 dBm or less and immunity of 50 dBc or more with respect to the input levels of interfering waves.

The reception characteristics of a tuner system of this type depend on the noise characteristics and distortion characteristics of a variable gain circuit that processes RF signals that have been just received by an antenna, for example. On the other hand, a tuner system installed in a mobile terminal is required to reduce its power consumption.

A variable gain circuit configured to process an RF signal in two paths in a switchable manner depending on the signal strength is disclosed (see, for example, U.S. Pat. No. 8,018,285). Specifically, an RF signal having a low signal strength is amplified by a transconductance amplifier provided in a first path. On the other hand, an RF signal having a high signal strength is attenuated by an attenuator provided in a second path, and then amplified by a transconductance amplifier provided in the second path.

With this configuration in which the first path is turned on and the second path is turned off if an RF signal has a low signal strength, and the first path is turned off and the second path is turned on if an RF signal has a high signal strength, an attempt to reduce noise and distortion has been carried out.

SUMMARY

In the configuration of U.S. Pat. No. 8,018,285, however, if the signal strength is high, the transconductance amplifier in the first path that is supposed to be kept off is intermittently turned on due to the signal amplitude, and the distorted signal leaks from the first path to the output. Consequently, the distortion characteristics of the variable gain circuit are deteriorated. If a grounded-gate amplifier is used as the transconductance amplifier, the input impedance fluctuates remarkably, and consequently, an input to the transconductance amplifier in the second path distorts the signal. These phenomena become more remarkable if a transistor with a low threshold voltage is used to reduce the power consumption of the variable gain circuit. It is therefore difficult, with the variable gain circuit of U.S. Pat. No. 8,018,285, to reduce the power consumption.

In view of the foregoing, it is therefore an object of the present disclosure to provide a cascode-type transconductance amplifier which is capable of reducing the distortion, and a variable gain circuit which is capable of reducing the noise, distortion, and power consumption.

To achieve the object, the present disclosure provides the following: A cascode-type transconductance amplifier includes an amplifier transistor connected to an input node, a cascode transistor having a source connected to a drain of the amplifier transistor and having a drain connected to an output node, and a switching circuit connecting or disconnecting a node to which the amplifier transistor and the cascode transistor are connected to or from a fixed potential in a switchable manner.

This configuration allows for connecting or disconnecting, by the switching circuit, the connection node of the amplifier transistor and the cascode transistor that are connected between the input and output nodes to or from the fixed potential in a switchable manner.

For example, if a signal having a large amplitude is input, the switching circuit is controlled to connect the connection node to the fixed potential. Consequently, the signal that has passed through the amplifier transistor is sent to the fixed potential via the switching circuit, which prevents the signal from leaking to the output node through the cascode transistor. On the other hand, if a signal having a small amplitude is input, the switching circuit is controlled to disconnect the connection node from the fixed potential. Consequently, the signal is transmitted to the output node through the amplifier transistor and the cascode transistor.

The use of this cascode-type transconductance amplifier as the amplifier in the first path prevents a distorted signal from being output through the first path even when a signal having a large amplitude has been input in a state where the first path is off, thereby maintaining the distortion characteristics of the variable gain circuit good.

Since the use of this cascode-type transconductance amplifier allows for maintaining the distortion characteristics good even when a signal having a large amplitude has been input, it is possible to employ a transistor having a low threshold voltage in the variable gain circuit.

These features enable the variable gain circuit to reduce the distortion and power consumption.

Further, the present disclosure provides a variable gain circuit including a first path and a second path which are connected in parallel between an input terminal and an output terminal and which are capable of amplifying a signal. The first path has a first variable attenuator which is connected to the input terminal, and which attenuates an input signal by a variable amount of attenuation, and a first variable gain transconductance amplifier which is connected between the first variable attenuator and the output terminal, and which amplifies an output from the first variable attenuator. The second path has a second variable attenuator which attenuates an input signal by a variable amount of attenuation, and a second variable gain transconductance amplifier which is connected between the second variable attenuator and the output terminal, and which amplifies an output from the second variable attenuator. An input side of the second variable attenuator is connected to the input terminal or between the first variable attenuator and the first variable gain transconductance amplifier. The first variable gain transconductance amplifier has a greater maximum gain than the second variable gain transconductance amplifier.

With this configuration, each of the first and second paths has the associated variable attenuator and the associated variable gain transconductance amplifier. The first variable gain transconductance amplifier is designed to have a greater maximum gain than the second variable gain transconductance amplifier. A signal input to the variable gain circuit passes through the first and second paths, and then, is output. Here, if the input signal has a large amplitude, the first variable attenuator is turned on and the first variable gain transconductance amplifier is turned off in the first path, while the second variable attenuator and the second variable gain transconductance amplifier are both turned on in the second path.

In this case, in the first path, the output from the first variable attenuator is input to the first variable gain transconductance amplifier. Therefore, even if the input signal has a large amplitude, the signal is attenuated by the first variable attenuator before being input to the first variable gain transconductance amplifier. This allows for preventing the first variable gain transconductance amplifier from being turning on intermittently due to the amplitude of a signal, thereby enabling reduction of distortion of the signal.

Further, since the first variable gain transconductance amplifier processes a signal of which the amplitude has been reduced by the first variable attenuator, a transistor having a low threshold voltage can be employed in the variable gain circuit.

These features enable the variable gain circuit to reduce the distortion and power consumption.

If an input signal has a small amplitude, the first variable attenuator is turned off and the first variable gain transconductance amplifier is turned on in the first path, while the second variable attenuator is turned off and the second variable gain transconductance amplifier is turned on in the second path.

In this case, the input signal is not attenuated but amplified in the first and second paths. In particular, the first variable gain transconductance amplifier provides a high degree of amplification, which enables noise reduction.

Furthermore, the input side of the second variable attenuator may be connected to a point between the first variable attenuator and the first variable gain transconductance amplifier, i.e., to the output side of the first variable attenuator. This configuration enables a signal in the second path to be attenuated by both the first and second variable attenuators. Therefore, the second variable attenuator needs to provide only a small amount of attenuation, which consequently allows for reducing the area of the variable gain circuit.

The present disclosure also provides a tuner system which includes at least one of the cascode-type transconductance amplifier or the variable gain circuit.

This configuration enables the tuner system to reduce the noise, distortion, and power consumption.

The present disclosure provides a cascode-type transconductance amplifier which is capable of reducing the distortion and a variable gain circuit which is capable of reducing the noise, distortion, and power consumption.

DETAILED DESCRIPTION

First Embodiment

Figure 1:
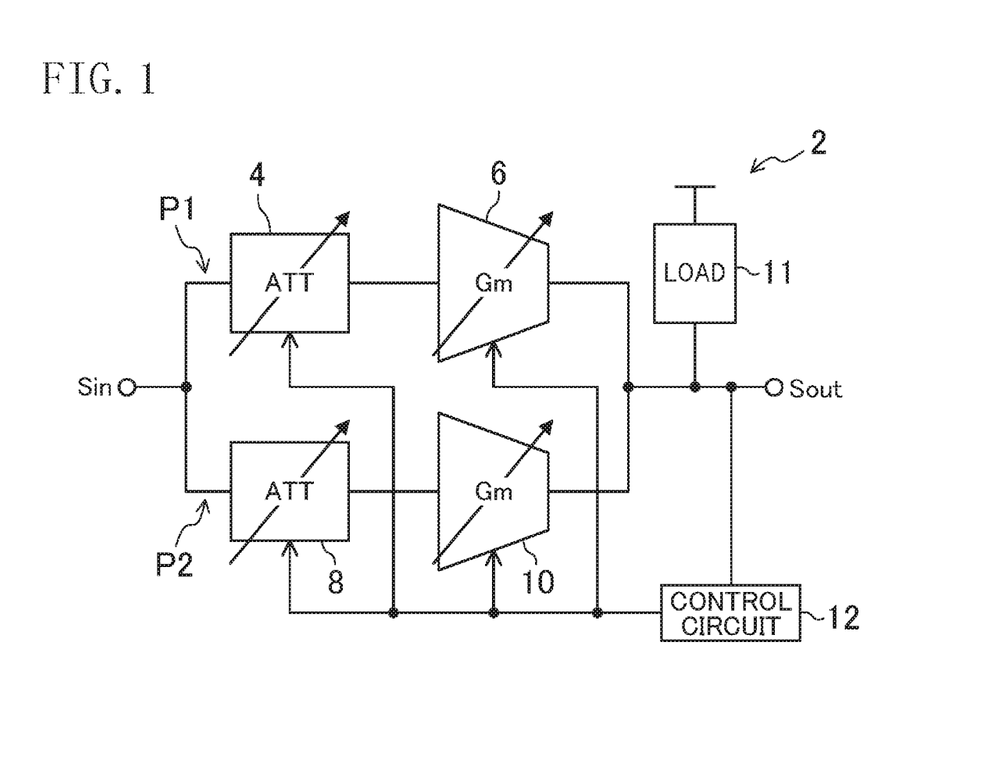
FIG. 1 is a diagram showing a configuration of a variable gain circuit according to a first embodiment.

FIG. 1 is a diagram showing a configuration of a variable gain circuit according to a first embodiment. The variable gain circuit 2 of this embodiment is configured to amplify a signal that is input to its input terminal Sin, and outputs the amplified signal from its output terminal Sout. The signal input to the input terminal Sin has been received by an antenna, for example.

Specifically, the variable gain circuit 2 includes a first path P1 and a second path P2 that are connected in parallel with each other between the input terminal Sin and the output terminal Sout.

The first path P1 has a variable attenuator 4 (hereinafter abbreviated as ATT4) connected to the input terminal Sin, and a variable gain transconductance amplifier 6 (hereinafter abbreviated as Gm6) connected between the ATT4 and the output terminal Sout.

The ATT4 is capable of attenuating the input signal by a variable amount of attenuation. The Gm6 is capable of amplifying the output from the ATT4 by a variable gain.

The second path P2 has a variable attenuator 8 (hereinafter abbreviated as ATT8) connected to the input terminal Sin, and a variable gain transconductance amplifier 10 (hereinafter abbreviated as Gm10) connected between the ATT8 and the output terminal Sout.

The ATT8 is capable of attenuating the input signal by a variable amount of attenuation. The Gm10 is capable of amplifying the output from the ATT8 by a variable gain. The Gm10 is designed to have a smaller maximum gain than the Gm6.

Configuration examples of the ATT4, the ATT8, the Gm6, and the Gm10 will be described later.

The variable gain circuit 2 further includes a load 11 and a control circuit 12 that are connected to the output terminal Sout.

The control circuit 12 controls the amounts of attenuation of the ATT4 and the ATT8 and the gains by the Gm6 and the Gm10, based on the signal output from the output terminal Sout, for example. The control circuit 12 may detect the signal level at a location other than the output terminal Sout of the variable gain circuit 2.

How the variable gain circuit 2 of this embodiment operates is now described. For example, if a signal received by the antenna has low field intensity, that is, if the amplitude of the signal input to the input terminal Sin is small, the control circuit 12 performs control to turn off both the ATT4 and the ATT8. Consequently, the ATT 4 and the ATT 8 allow the input signal to pass therethrough as it is.

The control circuit 12 also performs control such that the Gm6 and the Gm10 provides the respective maximum gains, for example. As a result, the Gm6 amplifies the input signal by the maximum gain that is greater than the maximum gain of the Gm10, and the Gm10 amplifies the input signal by the maximum gain of itself.

The outputs from the Gm6 and the Gm10 are combined with each other, and the resultant composite signal is output from the output terminal Sout.

Here, the maximum gain of the Gm6 is greater than that of the Gm10. Therefore, even if a signal having a low S/N ratio is input, the signal is amplified by the Gm6 without being attenuated by the ATT4. This allows for noise reduction.

On the other hand, if a signal received by the antenna has high field intensity, i.e., if the amplitude of the signal input to the input terminal Sin is large, the control circuit 12 performs control to turn on the ATT4 and the ATT8. Consequently, the ATT4 and the ATT8 attenuate the input signal by respective predetermined amounts of attenuation.

The control circuit 12 also performs control to turn off the Gm6 and turn on the Gm10. This control results in that the signal to be input to the Gm6 is attenuated by the ATT4, which can prevent the Gm6 from being turned on due to the amplitude of the signal. This allows for preventing the signal from being distorted on the input side of the Gm6 or the distorted signal from leaking to the output terminal Sout from the Gm6 that is off. Thus, distortion reduction of the variable gain circuit 2 is achieved.

In addition, even if the input signal has a large amplitude, the ATT4 reduces the amplitude of the signal to be input to the Gm6. This allows for employing a transistor having a low threshold voltage as the Gm6. The Gm6 comprised of such a transistor consumes less power, which results in a decrease in the power consumption of the variable gain circuit 2.

Thus, according to this embodiment, the first path P1 is provided with the ATT4 and the Gm6, the second path P2 is provided with the ATT8 and the Gm10, and the Gm 6 is designed to provide a greater maximum gain than the Gm10. If a signal input to the input terminal Sin has a small amplitude, the variable gain circuit performs the control to turn off the ATT4 and the ATT8 and to turn on the Gm6 and the Gm10. On the other hand, if a signal input to the input terminal Sin has a large amplitude, the variable gain circuit performs the control to turn on the ATT4, the ATT8, and the Gm10, and to turn off the Gm 6.

As can be seen from the foregoing, with this configuration, the variable gain circuit 2, which consumes less power while maintaining good noise characteristics and good distortion characteristics, is provided.

Figure 2:
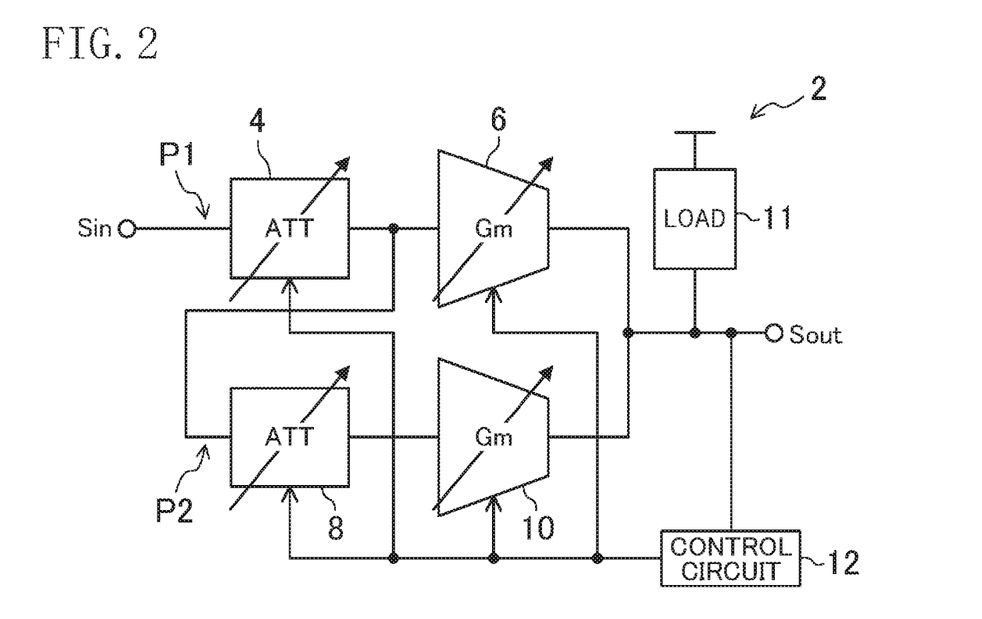
FIG. 2 is a diagram showing a configuration of a variable gain circuit according to a variation of the first embodiment.

In this embodiment, the input side of the ATT8 is connected to the input terminal Sin. The input side of the ATT8 may, however, be connected between the ATT4 and the Gm6, as shown in FIG. 2. In other words, the ATT4 may be shared by the first path P1 and the second path P2.

With this configuration, if a signal input to the input terminal Sin has a large amplitude, the signal is attenuated by the ATT4 and the ATT8 in the second path P2. Therefore, the amount of attenuation of the ATT8 can be smaller than that of the ATT4. This allows for reducing the area of the ATT8, which results in a decrease in the area of the variable gain circuit 2.

Next, configuration examples of the Gm6, the Gm10, the ATT4, and the ATT8 will be described with reference to the drawings. Note that in the following description, the term "fixed potential" refers to ground potential, for example.

Configuration Examples of Gm6 and Gm10

Specific examples of the Gm6 and the Gm10 are described below with reference to FIGS. 3 to 8.

Configuration Example 1

Figure 3:
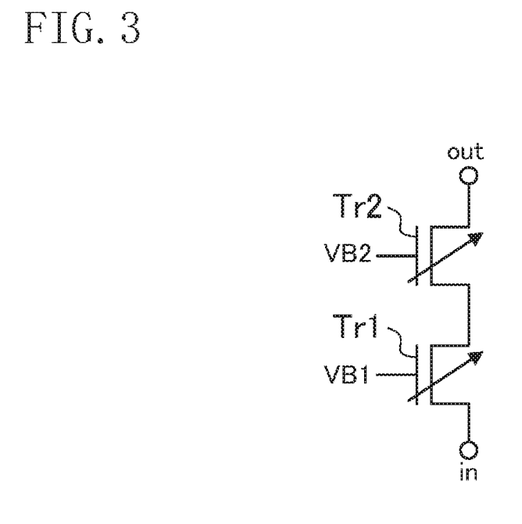
FIG. 3 is a diagram showing an example configuration of the variable gain transconductance amplifiers of FIG. 1.

FIG. 3 shows a configuration example of the variable gain transconductance amplifiers of FIG. 1. Specifically, as shown in FIG. 3, each of the variable gain transconductance amplifiers serving as the Gm 6 and Gm 10 includes a transistor Tr1 as an amplifier transistor and a transistor Tr2 as a cascode transistor. The transistors Tr1 and Tr2 are Nch transistors, for example.

The transistor Tr1 has its source connected to the input node in of the variable gain transconductance amplifier and has its gate connected to a bias voltage VB1. That is to say, the transistor Tr1 operates as a grounded-gate amplifier transistor.

The transistor Tr2 has its source connected to the drain of the transistor Tr1, its drain connected to the output node out of the variable gain transconductance amplifier, and its gate connected to a bias voltage VB2. Each of the bias voltages VB1 and VB2 may have an arbitrary magnitude.

Configuring each of the Gm6 and the Gm10 of FIG. 1 as shown in FIG. 3 makes the matching (impedance matching) between the antenna and the circuit of FIG. 1 good.

Here, the amplifier transistor Tr1 of the Gm6 is designed to be larger in size than the amplifier transistor Tr1 of the Gm10. As a result, the maximum gain of the Gm6 is greater than that of the Gm10.

The Gm6 and the Gm10 may suitably have other configurations as long as the maximum gain of the Gm6 is greater than that of the Gm10.

Configuration Example 2

Figure 4:
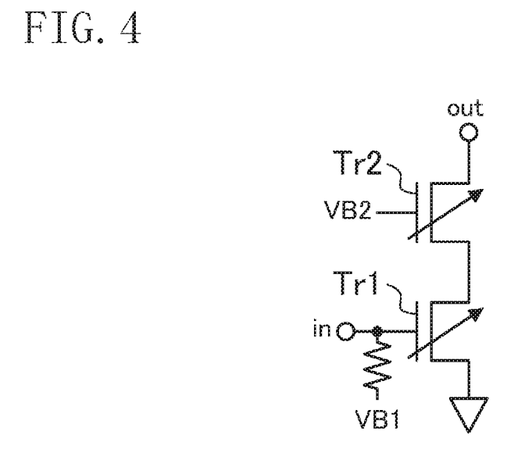
FIG. 4 is a diagram showing another example configuration of the variable gain transconductance amplifiers of FIG. 1.

FIG. 4 shows another configuration example of the variable gain transconductance amplifiers of FIG. 1. Here, differences between the configuration examples of FIGS. 3 and 4 are described mainly.

The transistor Tr1 has its gate which is connected to the input node in of the variable gain transconductance amplifier and to a bias voltage VB1 via a resistive element. The source of the transistor Tr1 is connected to a fixed potential. That is to say, this transistor Tr1 operates as a common-source transistor.

Configuring the transistor Tr1 as a common-source transistor in this manner makes the variable gain transconductance amplifier have good noise characteristics.

Configuration Example 3

Figure 5:
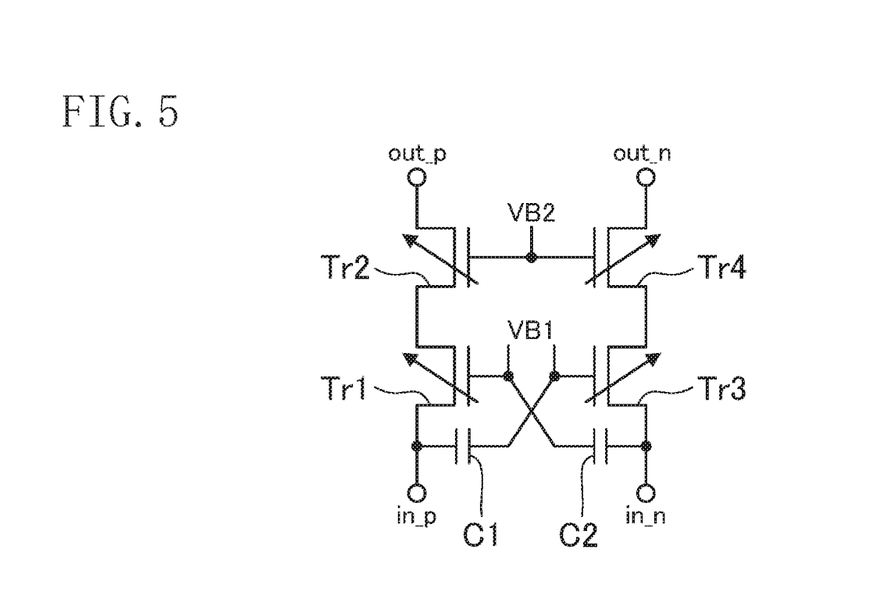
FIG. 5 is a diagram showing yet another example configuration of the variable gain transconductance amplifiers of FIG. 1.

FIG. 5 shows another configuration example of the variable gain transconductance amplifiers of FIG. 1. As shown in FIG. 5, the Gm6 and the Gm10 of FIG. 1 may be configured to process a differential signal. In this case, a differential signal generator circuit is suitably provided in or before the variable gain transconductance amplifier. Here, differences between the configuration examples of FIGS. 3 and 5 are described mainly.

The variable gain transconductance amplifier of FIG. 5 includes, in addition to the transistors Tr1 and Tr2, a transistor Tr3, a transistor Tr4, and capacitive elements C1 and C2.

The transistor Tr1 has its source connected to the input node in_p of the variable gain transconductance amplifier. The transistor Tr2 has its gate connected to the gate of the transistor Tr1, and its drain connected to the output node out_p of the variable gain transconductance amplifier.

The transistor Tr3 is a differential amplifier transistor that forms a differential pair with the transistor Tr1. The transistor Tr3 has its source connected to the differential input node in_n of the variable gain transconductance amplifier.

The transistor Tr4 is a differential cascode transistor that forms a differential pair with the transistor Tr2. The transistor Tr4 has its source connected to the drain of the transistor Tr3 and its drain connected to the differential output node out_n of the variable gain transconductance amplifier.

The source of the transistor Tr1 is connected to the gate of the transistor Tr3 via the capacitive element C1. The source of the transistor Tr3 is connected to the gate of the transistor Tr1 via the capacitive element C2.

The gates of the transistors Tr1 and Tr3 are connected to a bias voltage VB1, and the gates of the transistors Tr2 and Tr4 are connected to a bias voltage VB2.

Configuring each of the Gm6 and Gm10 of FIG. 1 as shown in FIG. 5 provides the advantages of both the configurations examples of FIGS. 3 and 4.

The intermediate node between the transistors Tr1 and Tr2 may be connectable to a fixed potential. Such a configuration will be described below.

Configuration Example 4

Figure 6:
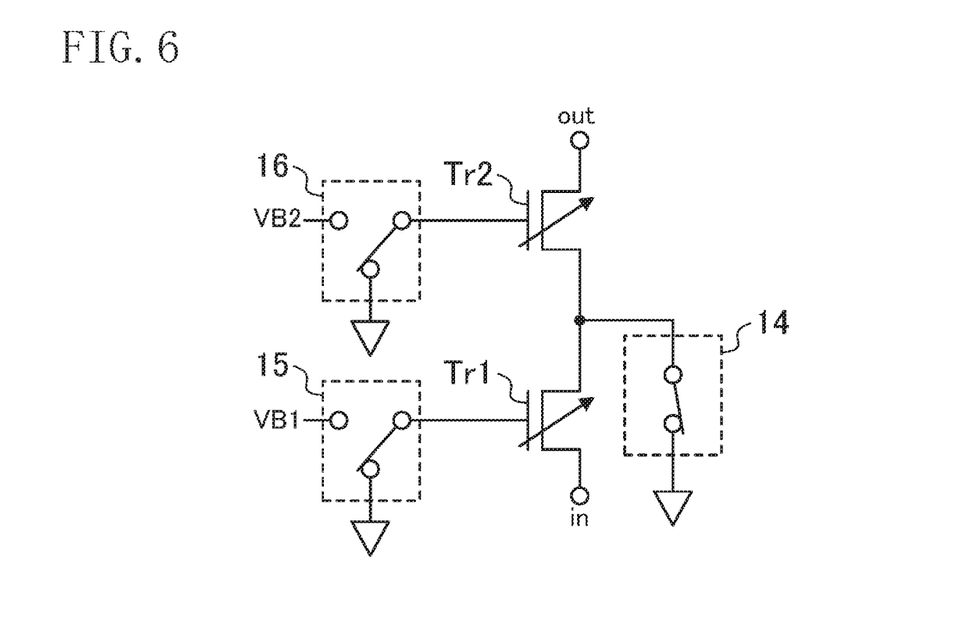
FIG. 6 is a diagram showing another example configuration of the Gm6 of FIG. 1.

FIG. 6 shows another configuration example of the Gm6 of FIG. 1. Here, differences between the configuration examples of FIGS. 3 and 6 are described mainly.

The variable gain transconductance amplifier of FIG. 6 includes, in addition to the transistors Tr1 and Tr2, a switch 14 which operates as a switching circuit and which is an Nch transistor, for example. This variable gain transconductance amplifier further includes a switch 15 which connects the gate of the transistor Tr1 to a fixed potential or a bias voltage VB1, and a switch 16 which connects the gate of the transistor Tr2 to a fixed potential or a bias voltage VB2.

The switch 14 connects or disconnects the intermediate node between the transistors Tr1 and Tr2 to or from a fixed potential in a switchable manner.

The switches 14, 15, and 16 are controlled by the control circuit 12 shown in FIG. 1. Specifically, if the Gm6 of FIG. 1 is off, the control circuit 12 turns on the switch 14 so as to connect the intermediate node between the transistors Tr1 and Tr2 to the associated fixed potential. The control circuit 12 also connects at least one of the switch 15 or 16 to the associated fixed potential.

On the other hand, if the Gm6 is on, the control circuit 12 turns off the switch 14 so as to disconnect the intermediate node between the transistors Tr1 and Tr2 from the associated fixed potential. The control circuit 12 performs control to connect the switches 15 and 16 to the bias voltages VB1 and VB2, respectively.

This configuration allows for hindering distortion from leaking from the input node in to the output node out when the Gm6 is off. Therefore, the use of the variable gain transconductance amplifier having the configuration shown in FIG. 6 as the Gm6 of FIG. 1 further improves the distortion characteristics of the variable gain circuit 2.

Configuration Example 5

Figure 7:
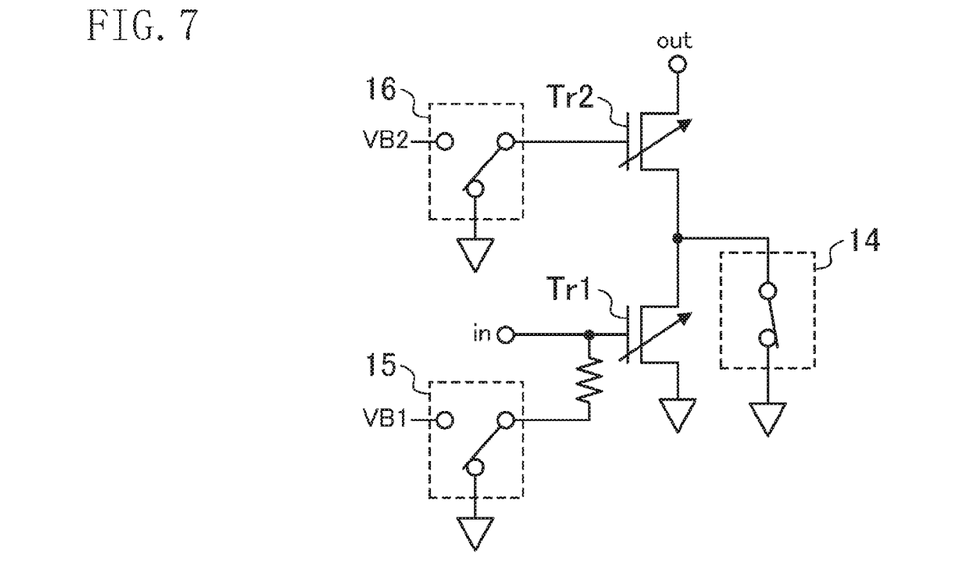
FIG. 7 is a diagram showing yet another example configuration of the Gm6 of FIG. 1.

FIG. 7 shows another configuration example of the Gm6 of FIG. 1. Here, differences between the configuration examples of FIGS. 4 and 7 are described mainly.

The variable gain transconductance amplifier of FIG. 7 includes, in addition to the transistors Tr1 and Tr2, a switch 14 which connects or disconnects the intermediate node between the transistors Tr1 and Tr2 to or from a fixed potential in a switchable manner. This variable gain transconductance amplifier further includes a switch 15 which connects an end of a resistive element, of which the other end is connected to the gate of the transistor Tr1, to a fixed potential or a bias voltage VB1, and a switch 16 which connects the gate of the transistor Tr2 to a fixed potential or a bias voltage VB2.

Configuration Example 6

Figure 8:
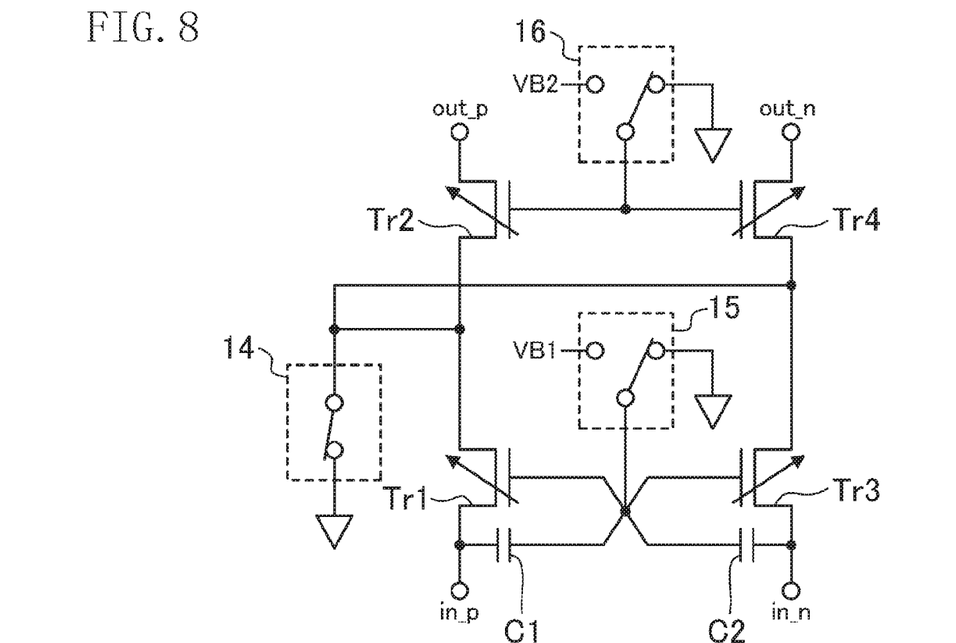
FIG. 8 is a diagram showing still another configuration of the Gm6 of FIG. 1.

FIG. 8 shows another configuration example of Gm6 of FIG. 1. Here, differences between the configuration examples of FIGS. 5 and 8 are described mainly.

The variable gain transconductance amplifier of FIG. 8 includes, in addition to the transistors Tr1 to Tr4, a switch 14 which connects or disconnects the intermediate node between the transistors Tr1 and Tr2 and the intermediate node between the transistors Tr3 and Tr4 to or from a fixed potential in a switchable manner.

This variable gain transconductance amplifier further includes a switch 15 which connects the gates of the transistors Tr1 and Tr3 to a fixed potential or a bias voltage VB1, and a switch 16 which connects the gates of the transistors Tr2 and Tr4 to a fixed potential or a bias voltage VB2.

The above configurations, in which, when the Gm6 is off, the intermediate node between the transistor Tr1 and Tr2 shown in FIGS. 6 to 8 and the intermediate node between the transistors Tr3 and Tr4 shown in FIG. 8 can be grounded, allows for further improving the distortion characteristics of the variable gain circuit 2.

The switch 15 or 16 may be omitted from the configurations of FIGS. 6 to 8. If so, the gates of the transistors Tr1 and Tr2 and the gates of the transistors Tr3 and Tr4 may be connected to the bias voltages VB1 and VB2, respectively.

Configuration Examples of ATT4 and ATT8

Next, specific examples of the ATT4 and the ATT8 will be described with reference to FIGS. 9 to 12.

Configuration Example 1

Figure 9:
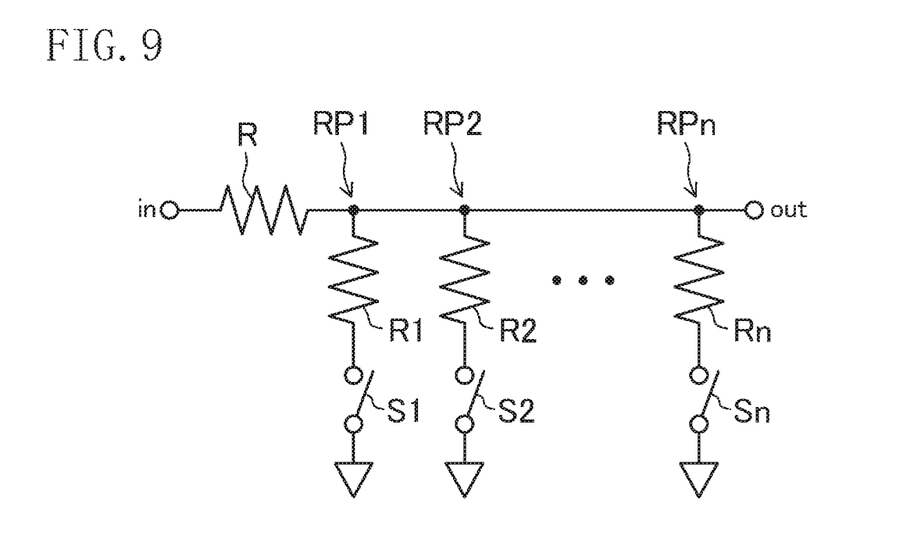
FIG. 9 is a diagram showing an example configuration of the variable attenuators of FIG. 1.

FIG. 9 shows a configuration example of the variable attenuators of FIG. 1. As shown in FIG. 9, each of the variable attenuators serving as the ATT4 and ATT8 includes a resistive element R and paths RP1 to RPn (wherein n is a natural number).

The resistive element R is provided between the input node in and the output node out of the variable attenuator. Each of the paths RP1 to RPn is configured to connect in parallel an associated point located between the input node in and the output node out to an associated fixed potential.

Specifically, each of the paths RP1 to RPn has an associated one of resistive elements R1 to Rn and an associated one of switches S1 to Sn that are respectively connected to the resistive elements R1 to Rn. The control circuit 12 shown in FIG. 1 performs control to turn on or off the switches S1 to Sn, which varies the amount of attenuation of the variable attenuator.

The input node in of this variable attenuator is connected to the input terminal Sin of the variable gain circuit 2 of FIG. 1.

Configuration Example 2

Figure 10:
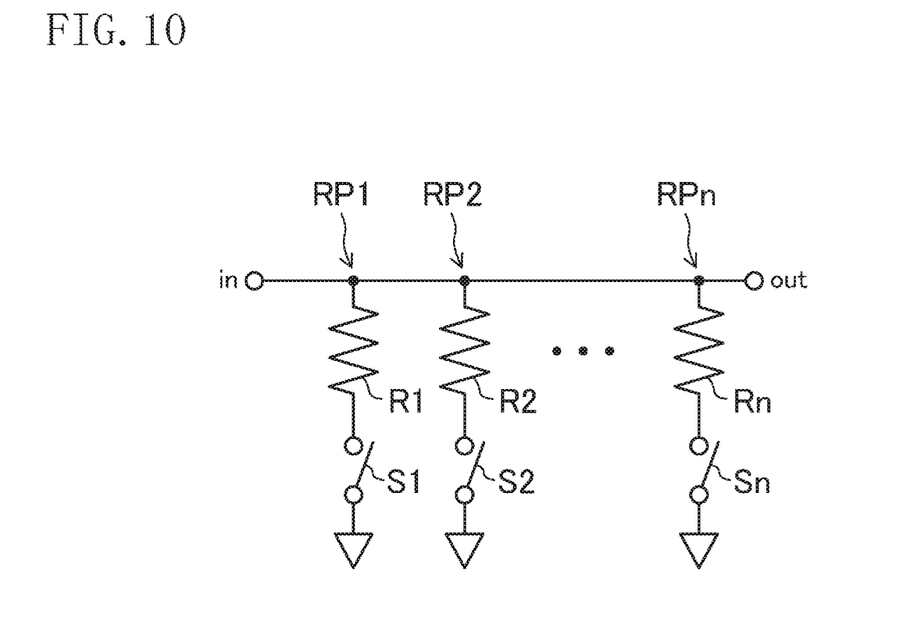
FIG. 10 is a diagram showing another example configuration of the variable attenuators of FIG. 1.

FIG. 10 shows another configuration example of the variable attenuators of FIG. 1. As shown in FIG. 10, in order to maintain the noise characteristics of the variable attenuator better, the resistive element R shown in FIG. 9 may be omitted, and the circuit configuration shown in FIG. 10 may be combined with the impedance of an input signal source.

Configuration Example 3

Figure 11:
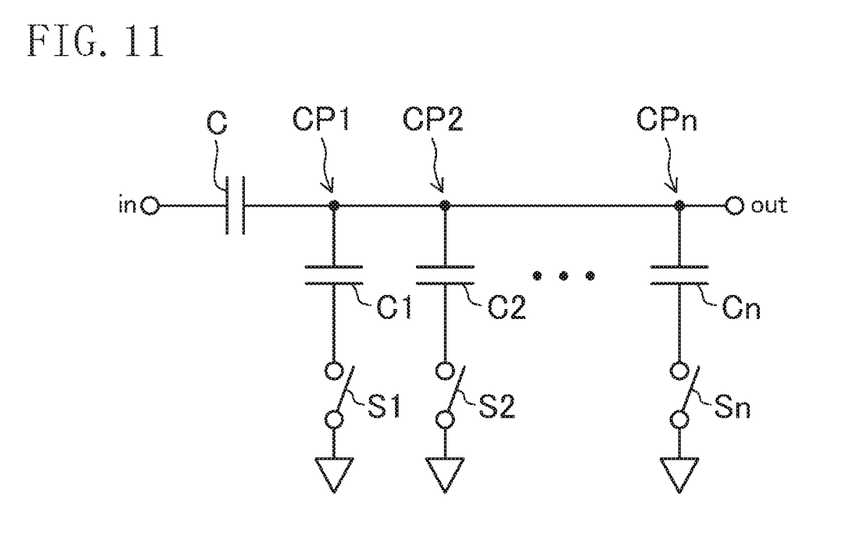
FIG. 11 is a diagram showing yet another example configuration of the variable attenuators of FIG. 1.

FIG. 11 shows another configuration example of the variable attenuators of FIG. 1. As shown in FIG. 11, the resistive elements R and R1 to Rn shown in FIG. 9 may be replaced with capacitive elements C and C1 to Cn.

Specifically, as shown in FIG. 11, each of the variable attenuators serving as the ATT4 and ATT8 has the capacitive element C and paths CP1 to CPn.

The capacitive element C is provided between the input node in and the output node out of the variable attenuator. Each of the paths CP1 to CPn is configured to connect in parallel an associated point located between the input node in and the output node out to an associated fixed potential.

Each of the paths CP1 to CPn has an associated one of the capacitive elements C1 to Cn and an associated one of switches S1 to Sn that are respectively connected to the capacitive elements C1 to Cn.

Configuration Example 4

Figure 12:
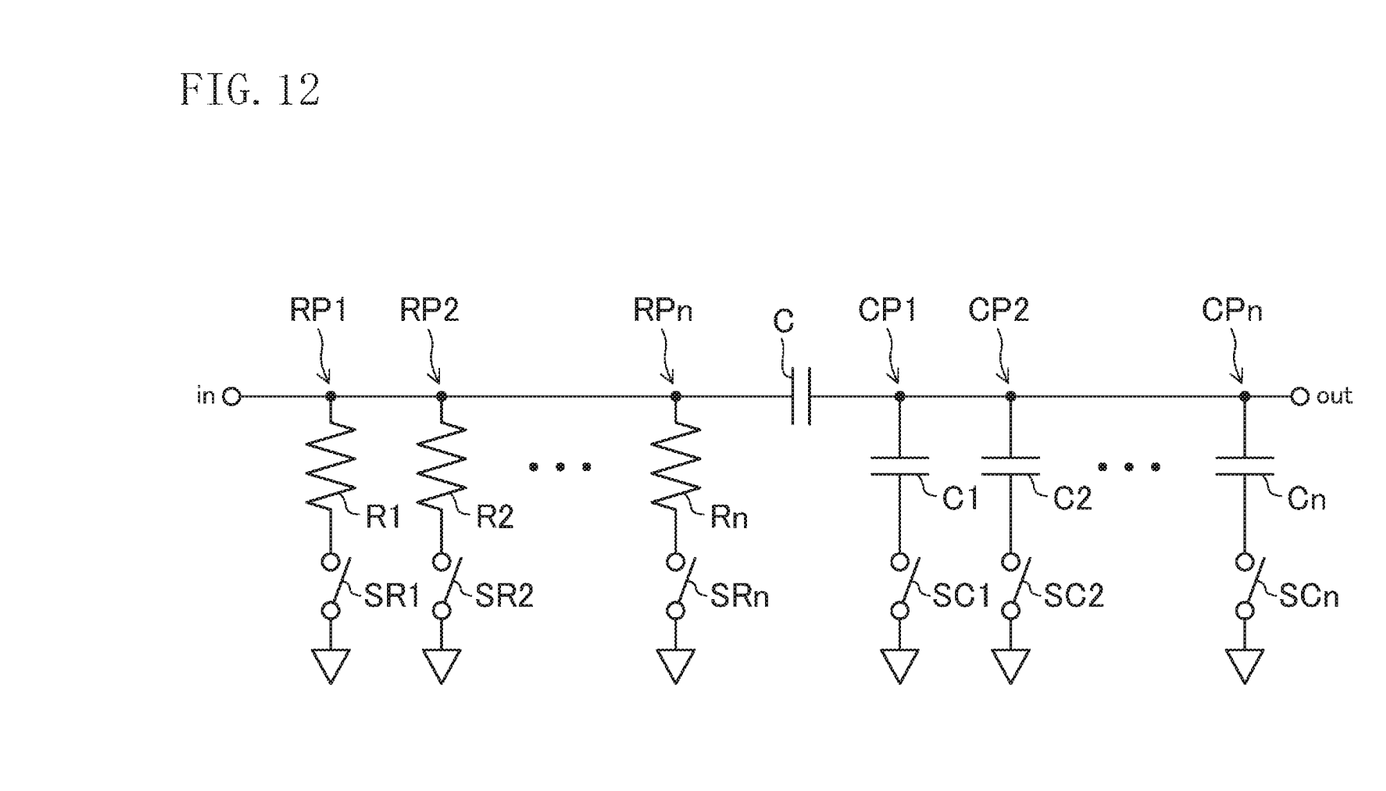
FIG. 12 is a diagram showing still another example configuration of the variable attenuators of FIG. 1.

FIG. 12 shows another configuration example of the variable attenuator of FIG. 1. The variable attenuator of FIG. 12 corresponds to the combination of the variable attenuators of FIGS. 9 and 11. Specifically, the variable attenuator may include paths RP1 to RPn that have resistive elements R1 to Rn and associated switches SR1 to SRn, and path CP1 to CPn that have a capacitive element C, capacitive elements C1 to Cn and associated switch SC1 to SCn.

The number of the paths RP1 to RPn may differ from the number of the paths CP1 to CPn.

This configuration allows for extending the range within which the amount of attenuation of the variable attenuator is varied.

As shown in FIGS. 9 to 12, each of the ATT4 and ATT8 may be comprised of two or more switch resistor circuits that each include a resistive element and a switch and that are connected in parallel with each other, and the amounts of attenuation of the ATT4 and ATT8 may be varied by means of resistive voltage division. Alternatively, each of the ATT4 and ATT8 may be comprised of two or more switch capacitor circuits that each include a capacitive element and a switch and that are connected in parallel with each other, and the amounts of attenuation of the ATT4 and ATT8 may be varied by means of capacitive voltage division. Further, each of the ATT4 and ATT8 may be configured as a combination of a switch resistor circuit and a switch capacitor circuit.

In each of the variable attenuators shown in FIGS. 9 to 12, a switch is suitably provided to any one of the paths RP1 to RPn or any one of the paths CP1 to CPn.

Each of the variable attenuators shown in FIGS. 9 to 12 may be provided with one path connecting a point between the input node in and output node out to a fixed potential, and the path may suitably be provided with at least one of a resistive element or a capacitive element and with a switch. That is to say, each attenuator may have any suitable configuration as long as the amount of attenuation is variable.

Next, another manner in which the variable gain circuit 2 of this embodiment operates will be described with reference to FIG. 13.

Figure 13:
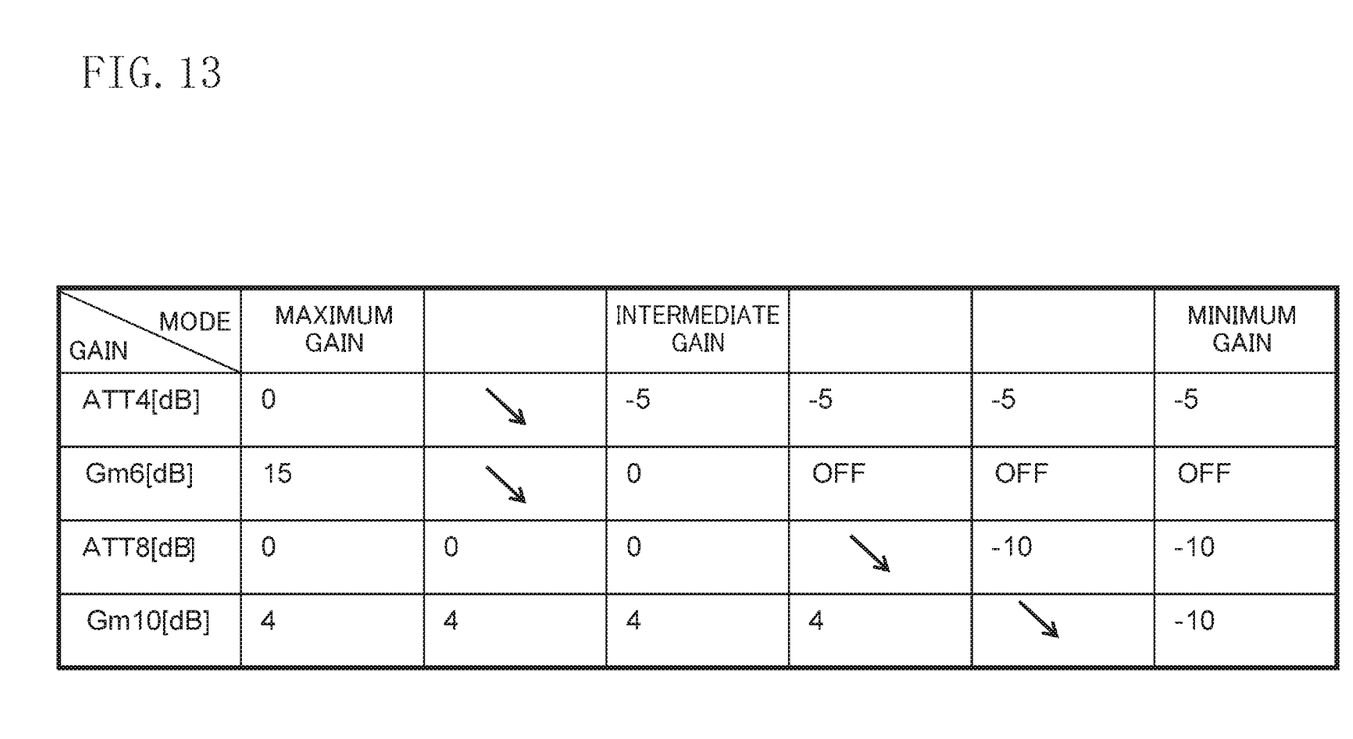
FIG. 13 is a table for explaining another example manner in which the variable gain circuit of FIG. 1 operates.

FIG. 13 shows how the variable gain circuit of FIG. 1 operates in a different manner Specifically, FIG. 13 shows an example in which the variable gain circuit 2 is controlled such that its gain varies gradually. The control circuit 12 performs control to gradually vary the amounts of attenuation of the ATT4 and ATT8 and the gains of the Gm6 and Gm10.

Specifically, if the variable gain circuit 2 operates to provide the maximum gain, the amount of attenuation of each of the ATT4 and ATT8 is 0 dB (i.e., the ATT4 and ATT8 are in a pass-through mode), and the maximum gains of the Gm6 and Gm10 are, for example, 15 dB and 4 dB, respectively.

If the maximum gain of the variable gain circuit 2 decreases to be an intermediate gain, the amount of attenuation of the ATT4 gradually increases to be −5 dB, for example, whereas the gain of the Gm6 gradually decreases to be 0 dB. At this time, the amount of attenuation of the ATT8 remains 0 dB and the gain of the Gm10 remains 4 dB.

If the gain of the variable gain circuit 2 further decreases to be the minimum gain, the amount attenuation of the ATT4 remains −5 dB, whereas the Gm6 is off, the amount of attenuation of the ATT8 is −10 dB, for example, and the gain of the Gm10 is −10 dB, for example.

As can be seen from the forgoing, the gain of the variable gain circuit 2 is attenuated in such a manner that, from a state in which the two paths P1 and P2 are both on, the gain of one path is reduced to become sufficiently smaller than the gain of the other, and then, the one path is brought into an off state. In this manner, the gain variation is implemented seamlessly.

To increase the gain, the variable gain circuit 2 operates in reverse, and the same or similar advantages are obtained.

Here, with the configuration of Patent Document 1, switching between the two paths is performed depending on the strength of a signal. Therefore, at the timing of the path switching, the gain of the variable gain circuit and the phase relationship between input and output signals fluctuate significantly, which results in serious deterioration of the signal quality.

This problem is reduced by controlling the gain of the variable gain circuit 2 in a manner as shown in FIG. 13.

In the operation shown in FIG. 13, the gradual increase in the amount of attenuation by the ATT4 may begin before or after the gain of the Gm6 begins to decrease gradually. Further, the gradual increase in the amount of attenuation of the ATT8 may begin before or after the gain of the Gm10 begins to decrease gradually.

FIG. 13 shows the operation example in which the gain of the variable gain circuit 2 is controllable at three values or more. The number of the steps in which the amounts of attenuation of the ATT4 and ATT8 and the gains of the Gm6 and Gm10 are varied can be set as desired.

Second Embodiment

Figure 14:
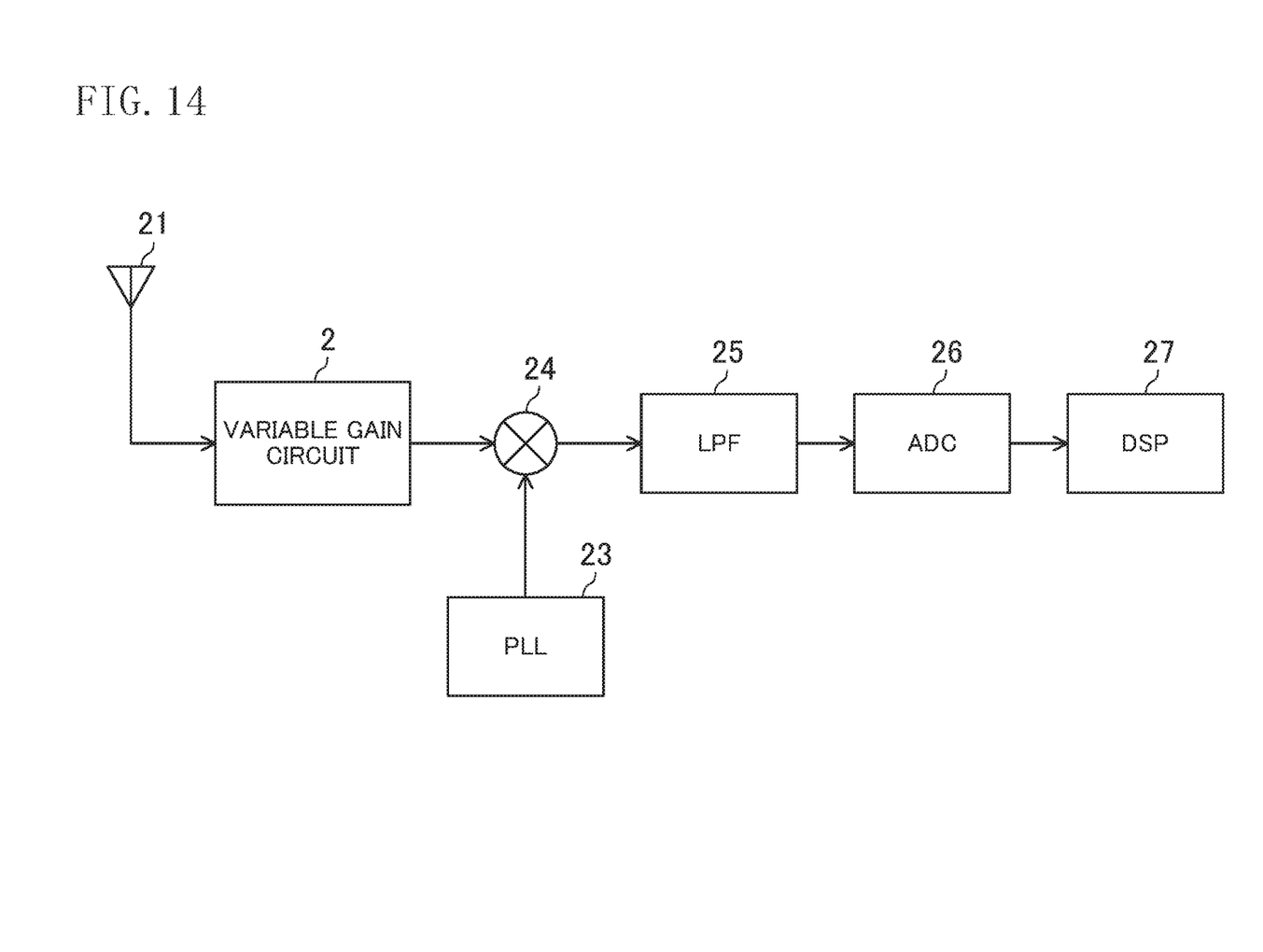
FIG. 14 is a diagram showing a configuration of a tuner system according to a second embodiment.

FIG. 14 shows a configuration of a tuner system according to a second embodiment. In FIG. 14, all of the signal processing blocks except the antenna 21 can be configured as an integrated circuit by using scaled complementary metal-oxide semiconductor (CMOS) process. The signal strength of an RF signal received by the antenna 21 is adjusted by the variable gain circuit 2. The RF signal may be a wire signal input via a cable. The variable gain circuit 2 is of the above-described embodiment.

The RF signal processed by the variable gain circuit 2 is converted into a baseband signal by a mixer with the use of a local oscillator signal generated by a phase locked loop (PLL) 23. The conversion method may be any one of a Low-IF method or a direct conversion method. The baseband signal is sent to a low-pass filter (LPF) 25, in which unnecessary high-frequency components are removed to a sufficient extent from the baseband signal. Thereafter, the signal is converted into a digital signal by an A/D converter (ADC) 26. The signal is finally subjected to demodulation and other processes by a digital signal processor (DSP) 27. Since the input level of the RF signal is detected by the DSP 27, the variability characteristics of the ATT4, the ATT8, the Gm6, and the Gm10 of the variable gain circuit 2 shown in FIG. 1 can be controlled in accordance with the detection results.

For example, if Channel 13 (473.143 MHz) of the Integrated Service Digital Broadcasting-Terrestrial in Japan is received, the PLL 3 outputs a local oscillator signal of 470.143 MHz, and the received RF signal is converted by the mixer 24 into a baseband signal having an intermediate frequency of 3 MHz that corresponds to the difference between the received frequency and the local oscillator signal frequency. At this time, although a high-frequency signal of 943.286 MHz that corresponds to the sum of the received frequency and the local oscillator signal frequency is also generated, such a high-frequency component is sufficiently attenuated through the filtering process by the LPF 25. For example, the signal band of the LPF 25 is the same as the signal band of the channel, i.e. 6 MHz. When other channels are received, the oscillation frequency of the PLL 23 is varied in accordance with the desired channels.

In the tuner system of this embodiment, the RF signal that has been just received by the antenna 21 is processed by the above-described variable gain circuit 2. This allows for obtaining good distortion characteristics and good noise characteristics and reducing the power consumption.

To process differential signals by the tuner system, the ADC 26 may be configured to perform single-end conversion, for example.

The tuner system of this embodiment may include the cascode-type transconductance amplifier shown in FIG. 6, for example.

The cascode-type transconductance amplifier of the present disclosure is capable of maintaining its distortion characteristic good. The variable gain circuit of the present disclosure has good distortion characteristics and good noise characteristics and is capable of reducing the power consumption. Therefore, the cascode-type transconductance amplifier and the variable gain circuit of the present disclosure are useful for stationary TV sets that receive analog and digital broadcasting waves, portable terminals, and other devices.

What is claimed is:

1. A variable gain circuit comprising:
   a first path and a second path which are connected in parallel between an input terminal and an output terminal and which are capable of amplifying a signal, wherein,
   the first path has:
      a first variable attenuator connected to the input terminal, and attenuating an input signal by a variable amount of attenuation, and
      a first variable gain transconductance amplifier connected between the first variable attenuator and the output terminal, and amplifying an output from the first variable attenuator,
   the second path has:
      a second variable attenuator attenuating an input signal by a variable amount of attenuation, and
      a second variable gain transconductance amplifier connected between the second variable attenuator and the output terminal, and amplifying an output from the second variable attenuator,
   an input side of the second variable attenuator is connected to the input terminal or between the first variable attenuator and the first variable gain transconductance amplifier, and
   the first variable gain transconductance amplifier has a greater maximum gain than the second variable gain transconductance amplifier,
   wherein
   the first variable gain transconductance amplifier includes:
      a first amplifier transistor having a source connected to an input node of the first variable gain transconductance amplifier, and having a biased gate, and
      a first cascode transistor having a source connected to a drain of the first amplifier transistor, and having a drain connected to an output node of the first variable gain transconductance amplifier, and
   the second variable gain transconductance amplifier includes:
      a second amplifier transistor having a source connected to an input node of the second variable gain transconductance amplifier, and having a biased gate, and
      a second cascode transistor having a source connected to a drain of the second amplifier transistor, and having a drain connected to an output node of the second variable gain transconductance amplifier.

2. The variable gain circuit of claim 1, wherein the first amplifier transistor is larger in size than the second amplifier transistor.

3. A tuner system comprising the variable gain circuit of claim 1.

4. A variable gain circuit comprising:
   a first path and a second path which are connected in parallel between an input terminal and an output terminal and which are capable of amplifying a signal, wherein,
   the first path has:
      a first variable attenuator connected to the input terminal, and attenuating an input signal by a variable amount of attenuation, and a first variable gain transconductance amplifier connected between the first variable attenuator and the output terminal, and amplifying an output from the first variable attenuator, the second path has:
a second variable attenuator attenuating an input signal by a variable amount of attenuation, and
a second variable gain transconductance amplifier connected between the second variable attenuator and the output terminal, and amplifying an output from the second variable attenuator, an input side of the second variable attenuator is connected to the input terminal or between the first variable attenuator and the first variable gain transconductance amplifier, and the first variable gain transconductance amplifier has a greater maximum gain than the second variable gain transconductance amplifier, wherein the first variable gain transconductance amplifier includes:
a first amplifier transistor connected to an input node of the first variable gain transconductance amplifier,
a first cascode transistor having a source connected to a drain of the first amplifier transistor, and having a drain connected to an output node of the first variable gain transconductance amplifier,
a first differential amplifier transistor forming a differential pair with the first amplifier transistor, and connected to a differential input node which is associated with the input node of the first variable gain transconductance amplifier, and
a first differential cascode transistor forming a differential pair with the first cascode transistor, having a source connected to a drain of the first differential amplifier transistor, and having a drain connected to a differential output node which is associated with the output node of the first variable gain transconductance amplifier, the second variable gain transconductance amplifier includes:
a second amplifier transistor connected to an input node of the second variable gain transconductance amplifier,
a second cascode transistor having a source connected to a drain of the second amplifier transistor, and having a drain connected to an output node of the second variable gain transconductance amplifier,
a second differential amplifier transistor forming a differential pair with the second amplifier transistor, and connected to a differential input node which is associated with the input node of the second variable gain transconductance amplifier, and
a second differential cascode transistor forming a differential pair with the second cascode transistor, having a source connected to a drain of the second differential amplifier transistor, and having a drain connected to a differential output node which is associated with the output node of the second variable gain transconductance amplifier, the first amplifier transistor has a source and a gate which are connected, via capacitive elements, respectively to a gate and a source of the first differential amplifier transistor, where the gates of the first amplifier transistor and the first differential amplifier transistor are biased, and the second amplifier transistor has a source and a gate which are connected, via capacitive elements, respectively to a gate and a source of the second differential amplifier transistor, where the gates of the second amplifier transistor and the second differential amplifier transistor are biased.

5. The variable gain circuit of claim 4, wherein the first amplifier transistor is larger in size than the second amplifier transistor.

6. A tuner system comprising the variable gain circuit of claim 4.

7. A variable gain circuit comprising:
a first path and a second path which are connected in parallel between an input terminal and an output terminal and which are capable of amplifying a signal, wherein, the first path has:
a first variable attenuator connected to the input terminal, and attenuating an input signal by a variable amount of attenuation, and
a first variable gain transconductance amplifier connected between the first variable attenuator and the output terminal, and amplifying an output from the first variable attenuator, the second path has:
a second variable attenuator attenuating an input signal by a variable amount of attenuation, and
a second variable gain transconductance amplifier connected between the second variable attenuator and the output terminal, and amplifying an output from the second variable attenuator, an input side of the second variable attenuator is connected to the input terminal or between the first variable attenuator and the first variable gain transconductance amplifier, and the first variable gain transconductance amplifier has a greater maximum gain than the second variable gain transconductance amplifier, wherein at least one of the first variable attenuator or the second variable attenuator includes:
at least one path which connects a point between input and output nodes of the at least one variable attenuator to a fixed potential and which has a resistive element, and
a first switching circuit which is provided to at least one of the at least one path and which connects or disconnects the associated path to or from the fixed potential in switchable manner.

8. The variable gain circuit of claim 7, wherein
the first variable attenuator includes:
the path which comprises a plurality of paths connected in parallel with each other, and
the first switching circuit which comprises a plurality of first switching circuits each provided to an associated one of the paths.

9. A tuner system comprising the variable gain circuit of claim 7.

10. A variable gain circuit comprising:
a first path and a second path which are connected in parallel between an input terminal and an output terminal and which are capable of amplifying a signal, wherein, the first path has:
a first variable attenuator connected to the input terminal, and attenuating an input signal by a variable amount of attenuation, and a first variable gain transconductance amplifier connected between the first variable attenuator and the output terminal, and amplifying an output from the first variable attenuator, the second path has:
a second variable attenuator attenuating an input signal by a variable amount of attenuation, and
a second variable gain transconductance amplifier connected between the second variable attenuator and the output terminal, and amplifying an output from the second variable attenuator, an input side of the second variable attenuator is connected to the input terminal or between the first variable attenuator and the first variable gain transconductance amplifier, and the first variable gain transconductance amplifier has a greater maximum gain than the second variable gain transconductance amplifier, wherein at least one of the first variable attenuator or the second variable attenuator includes:
at least one path which connects a point between input and output nodes of the at least one variable attenuator to a fixed potential and which has a capacitive element, and
a first switching circuit which is provided to at least one of the at least one path and which connects or disconnects the associated path to or from the fixed potential in a switchable manner.

11. The variable gain circuit of claim 10, wherein
the first variable attenuator includes:
the path which comprises a plurality of paths connected in parallel with each other, and
the first switching circuit which comprises a plurality of first switching circuits each provided to an associated one of the paths.

12. A tuner system comprising the variable gain circuit of claim 10.

13. A variable gain circuit comprising:
a first path and a second path which are connected in parallel between an input terminal and an output terminal and which are capable of amplifying a signal, wherein, the first path has:
a first variable attenuator connected to the input terminal, and attenuating an input signal by a variable amount of attenuation, and
a first variable gain transconductance amplifier connected between the first variable attenuator and the output terminal, and amplifying an output from the first variable attenuator, the second path has:
a second variable attenuator attenuating an input signal by a variable amount of attenuation, and
a second variable gain transconductance amplifier connected between the second variable attenuator and the output terminal, and amplifying an output from the second variable attenuator, an input side of the second variable attenuator is connected to the input terminal or between the first variable attenuator and the first variable gain transconductance amplifier, and the first variable gain transconductance amplifier has a greater maximum gain than the second variable gain transconductance amplifier, wherein
the first variable attenuator includes:

at least one path which connects a point between input and output nodes of the first variable attenuator to a fixed potential and which has a resistive element, and
a first switching circuit which is provided to at least one of the at least one path and which connects or disconnects the associated path to or from the fixed potential in a switchable manner.

14. The variable gain circuit of claim 13, wherein
the first variable attenuator includes:
the path which comprises a plurality of paths connected in parallel with each other, and
the first switching circuit which comprises a plurality of first switching circuits each provided to an associated one of the paths.

15. A tuner system comprising the variable gain circuit of claim 13.

16. A variable gain circuit comprising:
a first path and a second path which are connected in parallel between an input terminal and an output terminal and which are capable of amplifying a signal, wherein, the first path has:
a first variable attenuator connected to the input terminal, and attenuating an input signal by a variable amount of attenuation, and
a first variable gain transconductance amplifier connected between the first variable attenuator and the output terminal, and amplifying an output from the first variable attenuator, the second path has:
a second variable attenuator attenuating an input signal by a variable amount of attenuation, and
a second variable gain transconductance amplifier connected between the second variable attenuator and the output terminal, and amplifying an output from the second variable attenuator, an input side of the second variable attenuator is connected to the input terminal or between the first variable attenuator and the first variable gain transconductance amplifier, and the first variable gain transconductance amplifier has a greater maximum gain than the second variable gain transconductance amplifier, wherein
at least one of the first variable attenuator or the second variable attenuator includes:
at least one third path which connects a point between input and output nodes of the at least one variable attenuator to a fixed potential and which has a resistive element,
at least one fourth path which connects a point between the input and output nodes of the at least one variable attenuator to a fixed potential and which has a capacitive element, and
a second switching circuit which is provided to at least one path of at least one of the third path or the fourth path and which connects or disconnects the associated path to or from the associated fixed potential.

17. The variable gain circuit of claim 16, wherein,
the first variable attenuator includes:
the third path which comprises a plurality of third paths connected in parallel with each other,
the fourth path which comprises a plurality of fourth paths connected in parallel with each other, and
the second switching circuit which comprises a plurality of second switching circuits each provided to an associated one of the third and fourth paths.

18. A tuner system comprising the variable gain circuit of claim 16.

19. A variable gain circuit comprising:
a first path and a second path which are connected in parallel between an input terminal and an output terminal and which are capable of amplifying a signal, wherein,
the first path has:
  a first variable attenuator connected to the input terminal, and attenuating an input signal by a variable amount of attenuation, and
  a first variable gain transconductance amplifier connected between the first variable attenuator and the output terminal, and amplifying an output from the first variable attenuator,
the second path has:
  a second variable attenuator attenuating an input signal by a variable amount of attenuation, and
  a second variable gain transconductance amplifier connected between the second variable attenuator and the output terminal, and amplifying an output from the second variable attenuator,
an input side of the second variable attenuator is connected to the input terminal or between the first variable attenuator and the first variable gain transconductance amplifier, and
the first variable gain transconductance amplifier has a greater maximum gain than the second variable gain transconductance amplifier,
wherein,
the first variable gain transconductance amplifier includes:
  an amplifier transistor connected to an input node of the first variable gain transconductance amplifier,
  a cascode transistor having a source connected to a drain of the amplifier transistor, and having a drain connected to an output node of the first variable gain transconductance amplifier, and
  a third switching circuit connecting or disconnecting a node to which the amplifier transistor and the cascode transistor are connected to or from a fixed potential in a switchable manner.

20. The variable gain circuit of claim 19, wherein when the node is connected to the fixed potential by the third switching circuit, at least one of the amplifier transistor or the cascode transistor is off.

21. A tuner system comprising the variable gain circuit of claim 19.

* * * * *